US011303256B2

United States Patent
Chien

(10) Patent No.: US 11,303,256 B2
(45) Date of Patent: Apr. 12, 2022

(54) TEMPERATURE COMPENSATION CIRCUIT FOR POWER AMPLIFIER

(71) Applicant: RichWave Technology Corp., Taipei (TW)

(72) Inventor: Hwey-Ching Chien, Taipei (TW)

(73) Assignee: RichWave Technology Corp., Taipei (TW)

( * ) Notice: Subject to any disclaimer, the term of this patent is extended or adjusted under 35 U.S.C. 154(b) by 45 days.

(21) Appl. No.: 17/086,472

(22) Filed: Nov. 2, 2020

(65) Prior Publication Data

US 2021/0399698 A1 Dec. 23, 2021

(30) Foreign Application Priority Data

Jun. 17, 2020 (TW) ................................ 109120297

(51) Int. Cl.
*H03F 1/30* (2006.01)
*H03F 3/24* (2006.01)
*H03F 3/195* (2006.01)
*H03F 1/56* (2006.01)

(52) U.S. Cl.
CPC ............. *H03F 3/245* (2013.01); *H03F 1/56* (2013.01); *H03F 3/195* (2013.01); *H03F 2200/318* (2013.01); *H03F 2200/468* (2013.01); *H03F 2200/504* (2013.01); *H03F 2200/78* (2013.01)

(58) Field of Classification Search
CPC ....................................................... H03F 1/30
USPC ........................................ 330/289, 302, 296
See application file for complete search history.

(56) References Cited

U.S. PATENT DOCUMENTS

| 8,264,448 | B2 * | 9/2012 | Shteynberg | ............ H05B 45/28 |
| | | | | 345/82 |
| 2006/0160505 | A1 | 7/2006 | Ichitsubo | |
| 2009/0079358 | A1 * | 3/2009 | Shteynberg | ........ H05B 45/3725 |
| | | | | 315/291 |
| 2011/0090011 | A1 | 4/2011 | Chang | |
| 2012/0075016 | A1 | 3/2012 | Visser | |
| 2013/0288610 | A1 * | 10/2013 | Toh | ...................... H03G 3/3042 |
| | | | | 455/67.14 |
| 2014/0306761 | A1 | 10/2014 | Fujiwara | |

(Continued)

FOREIGN PATENT DOCUMENTS

TW I467916 B 1/2015
TW 201521367 A 6/2015

(Continued)

*Primary Examiner* — Henry Choe
(74) *Attorney, Agent, or Firm* — Winston Hsu

(57) ABSTRACT

A temperature compensation circuit for a power amplifier is provided, wherein data of circuit configurations corresponding to specific temperatures (including data associated with an output terminal voltage, a bias voltage, an adaptive bias, and a matching impedance of the power amplifier) for the power amplifier is stored in a read-only memory. Therefore, the temperature compensation circuit is capable of reading the data according to a temperature sensing signal to adjust the circuit configuration of the power amplifier accordingly, thereby, in a case of a constant input power of the power amplifier, an output power variance of the power amplifier is within a second interval (e.g., −10%~+10%) when an environment temperature varies within a first interval. Therefore, the power amplifier has a stable gain.

18 Claims, 3 Drawing Sheets

(56) References Cited

U.S. PATENT DOCUMENTS

| | | |
|---|---|---|
| 2015/0054587 A1 | 2/2015 | Yoshizaki |
| 2015/0222234 A1 | 8/2015 | Tabei |
| 2016/0249300 A1 | 8/2016 | Tsai |
| 2017/0194916 A1 | 7/2017 | Whittaker |
| 2020/0305244 A1* | 9/2020 | Durnan .................... H05B 6/70 |

FOREIGN PATENT DOCUMENTS

| | | |
|---|---|---|
| TW | 201633698 A | 9/2016 |
| TW | 201838147 A | 10/2018 |

* cited by examiner

TEMPERATURE COMPENSATION CIRCUIT FOR POWER AMPLIFIER

TECHNICAL FIELD

The present invention relates to a temperature compensation circuit, and more particularly, to a temperature compensation circuit for a power amplifier.

BACKGROUND

The radio-frequency (RF) power amplifier is a key component in various wireless communication system transmitters, so there are certain requirements for the linearity of the RF power amplifier. However, the operating characteristics (such as output power) of the power amplifier at different temperatures will drift, causing the linearity of the power amplifier (for example, the gain of input power to output power) to be changed, thereby affecting the performance of the entire radio frequency system.

In order to solve the problem that the linearity of the power amplifier is affected by temperature, it is necessary to provide a temperature compensation circuit for the power amplifier, so as to make the power amplifier with a stable gain.

SUMMARY

It is therefore an objective of the present invention to provide a temperature compensation circuit for a power amplifier, so as to have a stable gain.

The present invention discloses a temperature compensation circuit for a power amplifier, wherein an alternating current (AC) signal is inputted to a signal input terminal of the power amplifier and a signal output terminal of the power amplifier outputs the amplified AC signal. The temperature compensation circuit includes a temperature sensor, for sensing an environment temperature of the power amplifier, to generate a temperature sensing signal; a controllable output terminal voltage generator, coupled to the signal output terminal of the power amplifier, for adjusting an output terminal voltage provided to the signal output terminal of the power amplifier according to a first control signal; a controllable bias voltage generator, coupled to the signal input terminal of the power amplifier, for providing a bias voltage to the signal input terminal of the power amplifier according to a second control signal; an adaptive bias control circuit, for generating an adaptive bias adaptively changing with power of the AC signal to adjust the bias voltage, wherein the adaptive bias control circuit is coupled to the controllable bias voltage generator, and is utilized for adjusting a degree of the adaptive bias adaptively changing with the power of the AC signal according to a third control signal; a controllable impedance matching circuit, coupled to the signal input terminal or the signal output terminal of the power amplifier, for adjusting a matching impedance of the power amplifier according to a fourth control signal; and a read-only memory, coupled to the temperature sensor, the controllable output terminal voltage generator, the controllable bias voltage generator, the adaptive bias control circuit, and the controllable impedance matching circuit for storing data of the output terminal voltage, the bias voltage, the adaptive bias, and the matching impedance corresponding to the power amplifier at different environment temperatures; wherein the data of the output terminal voltage, the bias voltage, the adaptive bias, and the matching impedance is utilized for generating the first control signal, the second control signal, the third control signal and the fourth control signal according to the temperature sensing signal, respectively, such that in a case of a constant input power of the power amplifier, when the environment temperature varies within a first interval, an output power variance of the power amplifier is within a second interval.

DETAILED DESCRIPTION

Figure 1:
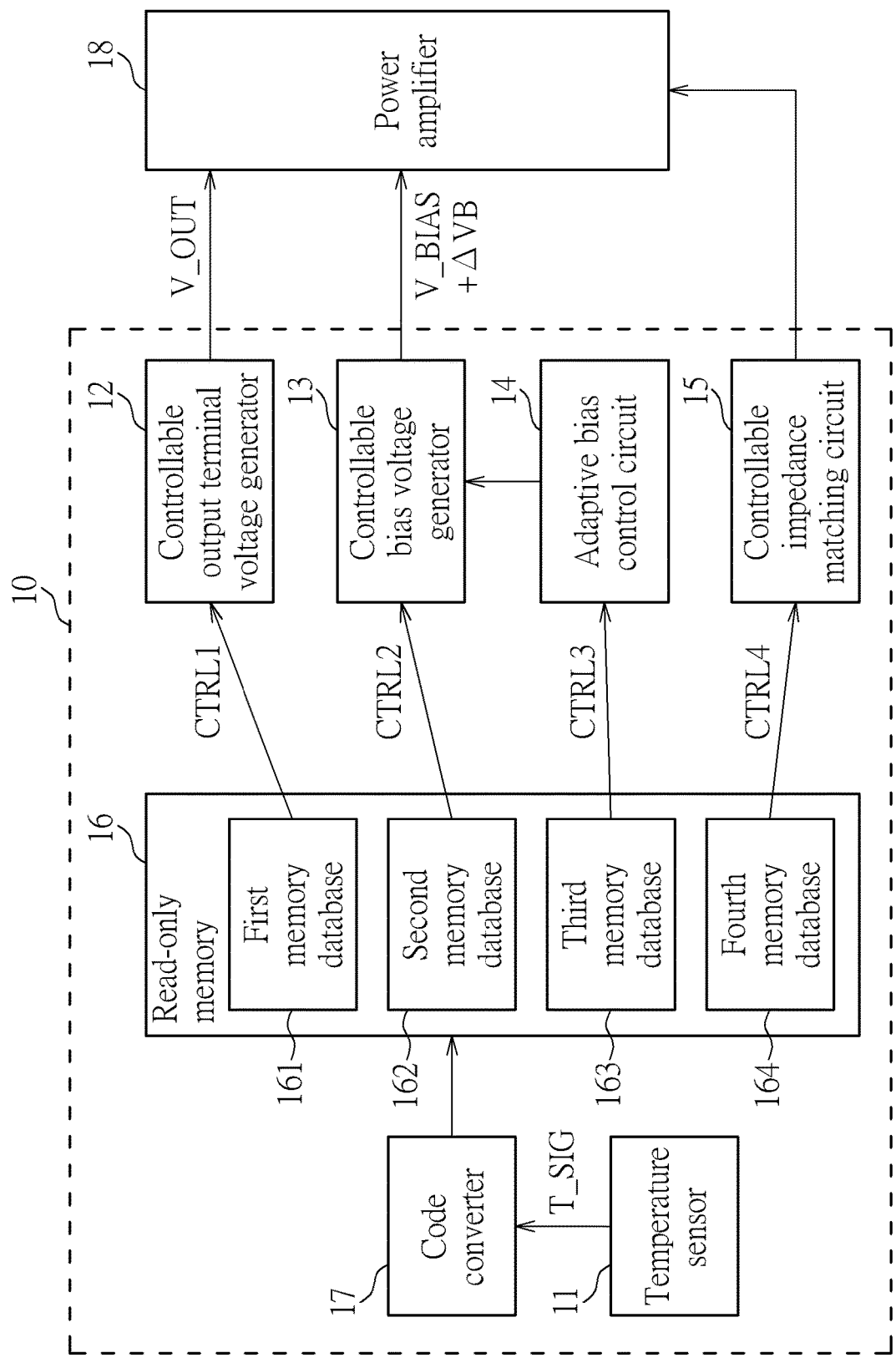
FIG. 1 is a functional block diagram of a temperature compensation circuit and a power amplifier according to an embodiment of the present invention.

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

Figure 2:
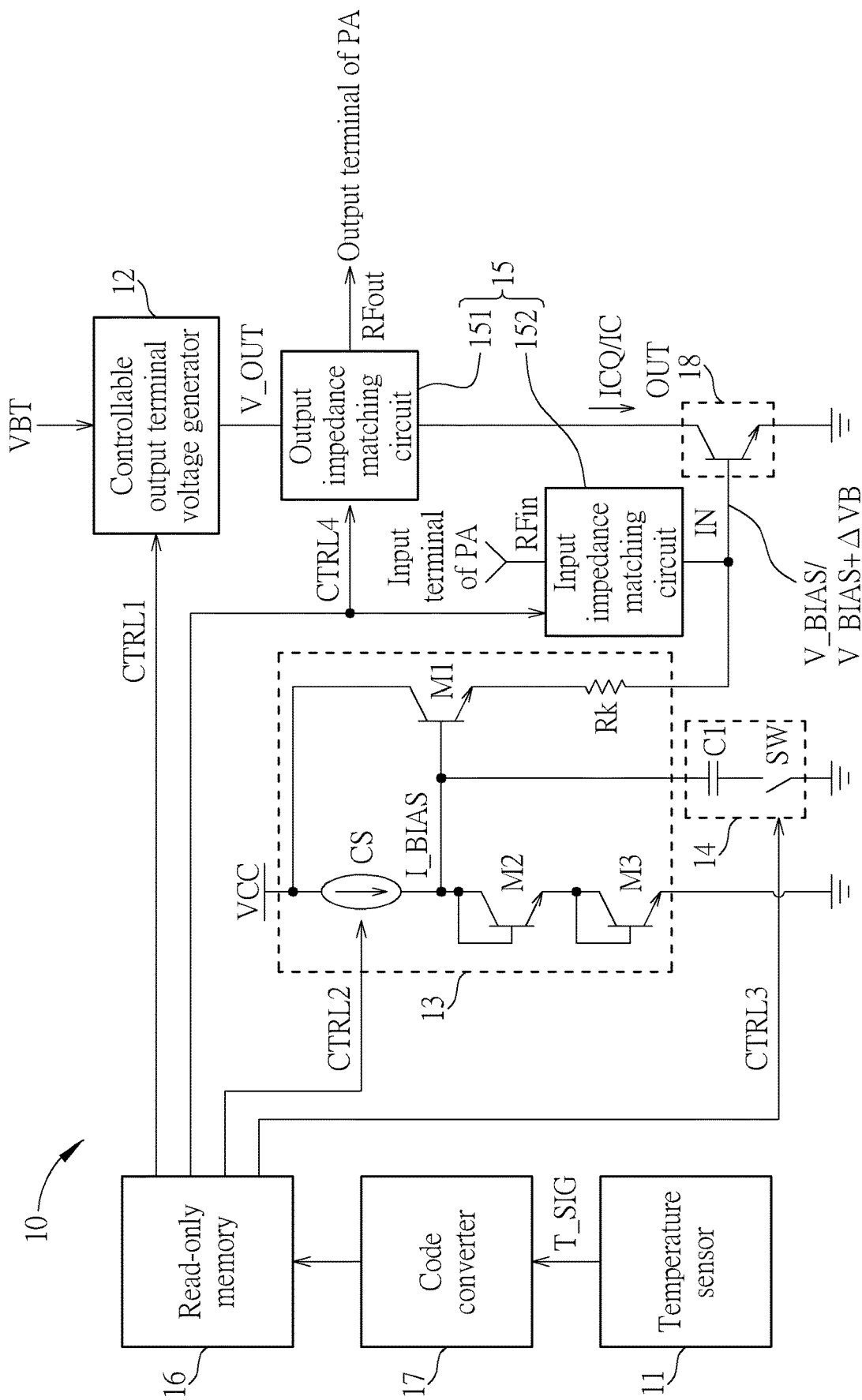
FIG. 2 is a functional block diagram of the temperature compensation circuit and the power amplifier shown in FIG. 1 according to an embodiment of the present invention.

FIG. 1 and FIG. 2 are functional block diagrams of a temperature compensation circuit 10 and a power amplifier 18 according to an embodiment of the present invention. In FIG. 1 and FIG. 2, the same components use the same symbols. Please refer to FIG. 1 and FIG. 2 at the same time. The temperature compensation circuit 10 is coupled to the power amplifier 18, and includes a temperature sensor 11, a controllable output terminal voltage generator 12, a controllable bias voltage generator 13, an adaptive bias control circuit 14, a controllable Impedance matching circuit 15 and a read-only memory 16. For the power amplifier 18, a signal input terminal IN is inputted with an input signal (for example, an alternating current (AC) radio-frequency signal) RFin, and a signal output terminal OUT outputs an amplified input signal RFout.

The temperature sensor 11 senses an environment temperature of the power amplifier 18, to generate a temperature sensing signal T_SIG. The controllable output terminal voltage generator 12 is coupled to the signal output terminal OUT of the power amplifier 18, and adjusts an output terminal voltage V_OUT provided to the signal output terminal OUT of the power amplifier 18 according to a first control signal CTRL1. The controllable bias voltage generator 13 is coupled to the signal input terminal IN of the power amplifier 18 for providing a bias voltage V_BIAS to the signal input terminal IN of the power amplifier 18 according to a second control signal CTRL2. The bias voltage V_BIAS generates a quiescent operating current ICQ flowing through the power amplifier 18. The adaptive bias control circuit 14 generates an adaptive bias ΔVB changing adaptively with the power of the AC signal RFin to adjust the bias voltage V_BIAS. The adaptive bias control circuit 14 is coupled to the controllable bias voltage generator 13, and adjusts a degree of the adaptive bias ΔVB adaptively changing with the power of the AC signal RFin according to a third control signal CTRL3 via the controllable bias voltage generator 13. For example, when the bias voltage V_BIAS is adaptively adjusted to V_BIAS+ΔVB due to the power of the AC signal RFin, the static operating current ICQ flowing through the power amplifier 18 would become a dynamic operating current IC. The third control signal CTRL3 may further adjust the degree of the adaptive bias ΔVB being affected by the power of the AC signal RFin. For example, ΔVB is adjusted to α×ΔVB, where α is an adjustment parameter. The controllable impedance matching circuit 15 is coupled to the signal input terminal IN or the signal output terminal OUT of the power amplifier 18, and adjusts a matching impedance of the power amplifier 18 according to a fourth control signal CTRL4.

The read-only memory 16 is coupled to the temperature sensor 11, the controllable output terminal voltage generator 12, the controllable bias voltage generator 13, the adaptive bias control circuit 14, and the controllable impedance matching circuit 15, for storing data of the output terminal voltage V_OUT, the bias voltage V_BIAS, the adaptive bias ΔVB and the matching impedance corresponding to the power amplifier 18 at different environment temperatures. The read-only memory 16 includes a first memory database 161, a second memory database 162, a third memory database 163, and a fourth memory database 164. The first memory database 161 is coupled between the temperature sensor 11 and the controllable output terminal voltage generator 12, for storing data of the output terminal voltage V_OUT corresponding to the power amplifier 18 at environment temperature, and generating the first control signal CTRL1 to the controllable output terminal voltage generator 12 according to the temperature sensing signal T_SIG. The second memory database 162 is coupled between the temperature sensor 11 and the controllable bias voltage generator 13, for storing the data of the bias voltage V_BIAS corresponding to the power amplifier 18 at environment temperature, and generating the second control signal CTRL2 to the controllable bias voltage generator 13 according to the temperature sensing signal T_SIG. The third memory database 163 is coupled between the temperature sensor 11 and the adaptive bias control circuit 14, for storing the data of the adaptive bias ΔVB corresponding to the power amplifier 18 at environment temperature, and generating the third control signal CTRL3 to the adaptive bias control circuit 14 according to the temperature sensing signal T_SIG. The fourth memory database 164 is coupled between the temperature sensor 11 and the controllable impedance matching circuit 15, for storing data of the matching impedance corresponding to the power amplifier 18 at environment temperature, and generating the four control signal CTRL4 to the controllable impedance matching circuit 15 according to the temperature sensing signal T_SIG.

In practical applications, behavior of the power amplifier 18 operating under temperature changes could be studied, to determine a circuit configuration at different temperatures. For example, given a set of circuit configuration of input power, output terminal voltage V_OUT, bias voltage V_BIAS, adaptive bias ΔVB, and matching impedance, a curve of output power versus temperature is recorded. Otherwise, under the premise of a given environment temperature, input power, output terminal voltage V_OUT, bias voltage V_BIAS, and adaptive bias ΔVB, a curve of output power versus matching impedance change is recorded. There are no restrictions on the research methods of the operation of the power amplifier 18 under temperature changes. Those skilled in the art can select the required research methods according to practical requirements.

Accordingly, the applicant determines the circuit configuration (including the output terminal voltage V_OUT, the bias voltage V_BIAS, the adaptive bias ΔVB and the matching impedance) of the power amplifier 18 at specific environment temperatures according to the experimental results, so that in a case of a constant input power of the power amplifier 18, when the environment temperature varies within a first interval, an output power variance of the power amplifier 18 is within a second interval. In other words, the data of the output terminal voltage V_OUT, the bias voltage V_BIAS, the adaptive bias ΔVB, and the matching impedance are utilized for generating the first control signal CTRL1, the second control signal CTRL2, the third control signal CTRL3 and the fourth control signal CTRL4 according to the temperature sensing signal T_SIG, respectively, so that in a case of a constant input power of the power amplifier 18, when the environment temperature varies within a first interval, an output power variance of the power amplifier 18 is within a second interval. In one embodiment, the first interval is −45 degrees to 125 degrees Celsius, and the second interval is −10% to +10%. In one embodiment, the data of the output terminal voltage V_OUT, the bias voltage V_BIAS, the adaptive bias ΔVB, and the matching impedance corresponding to the environment temperature are determined according to at least one of an error vector magnitude, a power gain, a power added efficiency, an input return loss, and an output return loss of the power amplifier 18.

In one embodiment, the temperature compensation circuit 10 further includes a code converter 17. The code converter 17 is coupled between the temperature sensor 11 and the read-only memory 16, for converting a coding manner of the temperature sensing signal T_SIG from a thermometer code to a binary code. The binary code of the temperature sensing signal T_SIG represents a memory address of the read-only memory 16, and a memory space corresponding to the memory address stores a circuit configuration corresponding to the temperature of the temperature sensing signal T_SIG. Therefore, the first memory database 161 reads the data of the output terminal voltage V_OUT corresponding to the environment temperature according to the memory address, to generate the first control signal CTRL1; the second memory database 162 reads the data of the bias voltage V_BIAS corresponding to the environment temperature according to the memory address, to generate the second control signal CTRL2; the third memory 163 reads data of the adaptive bias ΔVB corresponding to the environment temperature according to the memory address, to generate a third control signal CTRL3; and the fourth memory database 164 reads data of the matching impedance corresponding to the environment temperature according to the memory address, to generate the fourth control signal CTRL4.

Please refer to FIG. 2, the controllable output terminal voltage generator 12 receives a third system voltage VBT (e.g. a battery voltage), for adjusting the output voltage V_OUT provided to the power amplifier 18 according to the first control signal CTRL1. The controllable output terminal voltage generator 12 may be a low drop regulator (LDO) or a resistor (not shown in FIG. 2).

The controllable bias voltage generator 13 includes a first transistor M1. The first transistor M1 includes a first terminal, a control terminal and a second terminal. The first terminal receives a first system voltage VCC, the control terminal is coupled to the adaptive bias control circuit 14, and the second terminal is coupled to the signal input terminal IN of the power amplifier 18. In one embodiment, the first transistor M1 may be, but is not limited to, bipolar junction transistor (BJT), so that the first terminal is a collector, the second terminal is an emitter, and the control terminal is a base.

The controllable bias voltage generator 13 further includes a controllable current source CS. The controllable current source CS is coupled to the control terminal of the first transistor M1, and controls a current inputted to the control terminal of the first transistor M1 according to the first system voltage VCC and the second control signal CTRL2, to generate V_BIAS of the power amplifier 18 via a bias resistor.

In one embodiment, a controllable bias voltage generator 13 further includes a diode circuit coupled between the control terminal of the first transistor M1 and the system common terminal. The diode circuit may include two diodes connected in series, or transistors connected in the form of a diode. For example, the diode circuit includes a second transistor M2 and a third transistor M3 connected in series. In one embodiment, the second transistor M2 and the third transistor M3 may be, but not limited to, bipolar junction type transistors. A collector and a base of the second transistor M2 are coupled to the control terminal of the first transistor M1. An emitter of the second transistor M2 is coupled to a collector and a base of the third transistor M3. The collector and the base of the third transistor M3 are coupled to the emitter of the second transistor M2. An emitter of the third transistor M3 is coupled to the system common terminal (e.g., ground).

The adaptive bias control circuit 14 may be a controllable capacitor, coupled to the control terminal of the first transistor M1, and adjusts the adaptive bias ΔVB according to the power of the input signal and the third control signal CTRL3. The controllable capacitor includes a plurality of capacitor control units, and each capacitor control unit includes a switch SW and a capacitor C1 as shown in FIG. 2. The switch SW is coupled between the read-only memory 16 and a system common terminal (for example, a system ground). One end of the capacitor C1 is coupled to the switch SW, and another end of the capacitor C1 is coupled to the system common terminal or the control terminal of the first transistor M1. The switch SW is connected or disconnected according to the third control signal CTRL3, to control an effective capacitance value of the each capacitor control unit to the control terminal of the first transistor M1.

The controllable impedance matching circuit 15 includes one or both of an output impedance matching circuit 151 and an input impedance matching circuit 152. The output impedance matching circuit 151 is coupled between the controllable output terminal voltage generator OUT 12 and the output terminal of the power amplifier 18, and adjusts the output impedance of the power amplifier 18 according to the fourth control signal CTRL4. The input impedance matching circuit 152 is coupled between the signal input terminal IN of the power amplifier 18 and a system signal input terminal (input terminal of PA), and adjusts the input impedance of the power amplifier 18 according to the fourth control signal CTRL4. In one embodiment, the output impedance matching circuit 151 or the input impedance matching circuit 152 may be a T-type variable impedance matching network or a π-type variable impedance matching network, which may include one or a plurality of a variable resistors, variable capacitors, variable inductors or a combination of the above three.

In an embodiment, since the read only memory 16 is suitable to be fabricated by a CMOS (Complementary Metal-Oxide-Semiconductor, CMOS) process, in order to simplify the process and reduce costs, the temperature compensation circuit 10 and the power amplifier 18 may also be fabricated by a CMOS process, and are disposed on a same die.

In one embodiment, the power amplifier 18 is a Metal-Oxide Semiconductor Field Effect Transistor (MOSFET), the output terminal of the power amplifier 18 is a drain of the MOSFET, the input terminal of the power amplifier 18 is a gate of the MOSFET, and a source of the MOSFET is coupled to the system common terminal (e.g., a ground).

In one embodiment, the power amplifier 18 is a transistor, the output terminal of the power amplifier 18 is a first terminal of the transistor, and the input terminal of the power amplifier 18 is a control terminal of the transistor, and a second terminal of the transistor is coupled to a system common terminal, and the transistor is a germanium-silicon (GaSi) NPN Heterojunction bipolar transistor.

Under the circuit structure of FIG. 2, the present invention determines the circuit configuration (which includes the output voltage V_OUT, the bias voltage V_BIAS, the adaptive bias ΔVB and the matching impedance) of the power amplifier 18 at a specific environment temperature according to the experimental results, and stores circuit configuration data in the read-only memory 16. As a result, the temperature compensation circuit 10 could read the circuit configuration data according to the temperature sensing signal T_SIG, and adjusts the circuit configuration of the power amplifier 18 accordingly, such that, in a case of a constant input power of the power amplifier 18, when the environment temperature varies within a first interval, an output power variance of the power amplifier 18 is within a second interval (for example, −10% to +10%). Therefore, under the circuit structure of FIG. 2, the power amplifier 18 of the present invention has a stable gain.

Figure 3:
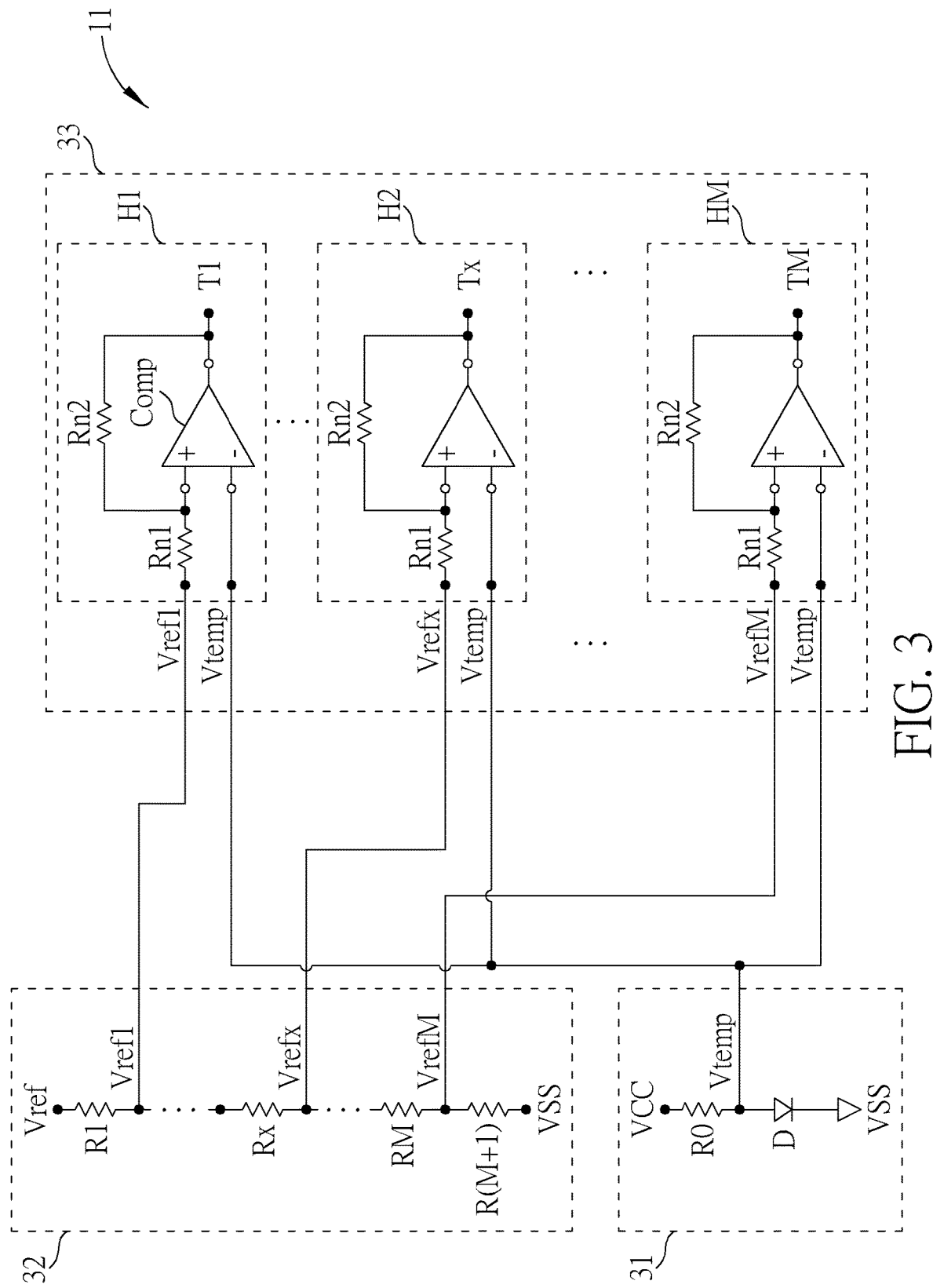
FIG. 3 is a schematic diagram of the temperature sensor shown in FIG. 1 according to an embodiment of the present invention.

FIG. 3 is a schematic diagram of the temperature sensor 11 according to an embodiment of the present invention. The temperature sensor 11 includes a temperature sensing circuit 31, a reference voltage generating circuit 32 and a comparison circuit 33. The temperature sensing circuit 31 is coupled to the comparison circuit 33, and senses the environment temperature of the power amplifier 18, to generate a temperature sensing voltage Vtemp. The temperature sensing circuit 31 includes a resistor R0 and a diode D. One end of the resistor R0 is coupled to the first system voltage VCC, and another end is coupled to an anode of the diode D. A cathode of the diode D is coupled to a second system voltage VSS, and the anode is coupled to the resistor R0. The anode of the diode D outputs the temperature sensing voltage Vtemp. In one embodiment, the temperature sensing circuit 31 is disposed adjacent to the power amplifier 18, to measure the environment temperature of the power amplifier 18.

The reference voltage generating circuit 32 is coupled to the comparison circuit 33, and generates M different reference voltages, such as reference voltages Vref1, Vref2-VrefM. The reference voltage generating circuit 32 includes resistors R1, R2 to RM, and R(M+1) connected in series. One end of the resistor R1 is coupled to a system reference voltage Vref; another end of the resistor R1 is coupled to one end of the resistor R2 (not shown in FIG. 3), for outputting the reference voltage Vref1 to the comparison circuit 33. Another end of the resistor R2 is coupled to one end of the resistor R3 (not shown in FIG. 3), for outputting the reference voltage Vref2 to the comparison circuit 33. By the same token, coupling manners of the resistors R2-RM could be deduced. Another end of the resistor RM is coupled to one end of the resistor R(M+1), for outputting the reference voltage VrefM, and another end of the resistor R(M+1) is coupled to the second system voltage VSS.

The comparison circuit 33 includes M comparators, for generating the temperature sensing signal T_SIG with a coding manner of a thermometer code according to the temperature sensing voltage and the M different reference voltages Vref1-VrefM, wherein the temperature sensing signal T_SIG includes M coding bits T1~TM. In one embodiment, the M comparators of the comparison circuit 33 are M hysteresis comparators H1, H2-HM. Structure of each hysteresis comparator may be identical. Take an x-th hysteresis comparator Hx for example, the hysteresis comparator Hx includes a comparator Comp, a first resistor Rn1 and a second resistor Rn2. The comparator Comp includes a first input terminal, for receiving the temperature sensing voltage Vtemp, a second input terminal, and, an output terminal, for outputting a first thermometer value. One end of the first resistor Rn1 receives a reference voltage Vrefx of the M different reference voltages Vref1, Vref2-VrefM, and another end of the first resistor Rn1 is coupled to the first input terminal of the comparator Comp. One end of the second resistor Rn2 is coupled to the first input terminal of the comparator Comp, and another end of the second resistor Rn2 is coupled to the output terminal of the comparator Comp and outputs an x-th coding bit Tx of the temperature sensing signal T_SIG. Further, the code converter 17 (not shown in FIG. 3) converts the temperature sensing signal T_SIG from the M-bit thermometer code to the N-bit binary code, where M=2^N−1.

Under the circuit structure of FIG. 3, the present invention may prevent the temperature sensor 11 from generating a temperature sensing signal T_SIG changing too greatly or too frequently, so as to avoid the subsequent controllable output terminal voltage generator 12, the controllable bias voltage generator 13, the adaptive bias control circuit 14, the controllable impedance matching circuit 15, and the read-only memory 16 operating too frequently, resulting in more power consumption.

In summary, the present invention provides the circuit configuration (which includes output terminal voltage, bias voltage, adaptive bias and matching impedance) of the power amplifier at a specific environment temperature, and stores the circuit configuration data in the read-only memory. As a result, the temperature compensation circuit of the present invention may read circuit configuration data according to the temperature sensing signal, to adjust circuit configuration of the power amplifier accordingly. Therefore, in a case of a constant input power of the power amplifier, when the environment temperature varies within a first interval, an output power variance of the power amplifier 18 is within a second interval (for example, −10% to +10%). Therefore, the power amplifier of the present invention has a stable gain.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A temperature compensation circuit, for a power amplifier, wherein an alternating current (AC) signal is inputted to a signal input terminal of the power amplifier and a signal output terminal of the power amplifier outputs an amplified AC signal, the temperature compensation circuit comprising:
   a temperature sensor, for sensing an environment temperature of the power amplifier, to generate a temperature sensing signal;
   a controllable output terminal voltage generator, coupled to the signal output terminal of the power amplifier, for adjusting an output terminal voltage provided to the signal output terminal of the power amplifier according to a first control signal;
   a controllable bias voltage generator, coupled to the signal input terminal of the power amplifier, for providing a bias voltage to the signal input terminal of the power amplifier according to a second control signal;
   an adaptive bias control circuit, for generating an adaptive bias adaptively changing with power of the AC signal to adjust the bias voltage, wherein the adaptive bias control circuit is coupled to the controllable bias voltage generator, and is further utilized for adjusting a degree of the adaptive bias adaptively changing with the power of the AC signal according to a third control signal;
   a controllable impedance matching circuit, coupled to the signal input terminal or the signal output terminal of the power amplifier, for adjusting a matching impedance of the power amplifier according to a fourth control signal; and
   a read-only memory, coupled to the temperature sensor, the controllable output terminal voltage generator, the controllable bias voltage generator, the adaptive bias control circuit, and the controllable impedance matching circuit, for storing data of the output terminal voltage, the bias voltage, the adaptive bias, and the matching impedance corresponding to the power amplifier at different environment temperatures;
   wherein the data of the output terminal voltage, the bias voltage, the adaptive bias, and the matching impedance is utilized for generating the first control signal, the second control signal, the third control signal and the fourth control signal according to the temperature sensing signal, respectively, such that in a case of a constant input power of the power amplifier, when the environment temperature varies within a first interval, an output power variance of the power amplifier is within a second interval.

2. The temperature compensation circuit of claim 1, further comprising:
   a code converter, coupled between the temperature sensor and the read-only memory, for converting a coding manner of the temperature sensing signal from a thermometer code to a binary code.

3. The temperature compensation circuit of claim 1, wherein the temperature sensor comprises:
   a temperature sensing circuit, for sensing the environment temperature of the power amplifier to generate a temperature sensing voltage;
   a reference voltage generating circuit, for generating M different reference voltages; and
   a comparison circuit, comprising M comparators, for generating the temperature sensing signal with a coding manner of a thermometer code according to the temperature sensing voltage and the M different reference voltages.

4. The temperature compensation circuit of claim 3, wherein the comparison circuits further comprises M hysteresis comparators.

5. The temperature compensation circuit of claim 4, wherein each hysteresis comparator comprises:
   a comparator, comprising:
     a first input terminal, for receiving the temperature sensing voltage;
     a second input terminal; and an output terminal, for outputting an x-th thermometer value;
a first resistor, having one end for receiving an x-th reference voltage of the M different reference voltages, and another end coupled to the first input terminal of the comparator;
a second resistor, having one end coupled to the first input terminal of the comparator, and another end coupled to the output terminal of the comparator.

6. The temperature compensation circuit of claim 1, wherein the read-only memory comprises:
a first memory database, coupled between the temperature sensor and the controllable output terminal voltage generator, for storing data of the output terminal voltage corresponding to the power amplifier at the environment temperature;
a second memory database, coupled between the temperature sensor and the controllable bias voltage generator, for storing data of the bias voltage corresponding to the power amplifier at the environment temperature;
a third memory database, coupled between the temperature sensor and the adaptive bias control circuit, for storing data of the adaptive bias corresponding to the power amplifier at the environment temperature; and
a fourth memory database, coupled between the temperature sensor and the controllable impedance matching circuit, for storing data of the matching impedance corresponding to the power amplifier at the environment temperature.

7. The temperature compensation circuit of claim 1, wherein the first interval is −45 degrees Celsius to 125 degrees Celsius, and the second interval is −10% to +10%.

8. The temperature compensation circuit of claim 1, wherein the data of the output terminal voltage, the bias voltage, the adaptive bias, and the matching impedance corresponding to the environment temperature are determined according to at least one of an error vector magnitude, a power gain, a power added efficiency, an input return loss, and an output return loss of the power amplifier.

9. The temperature compensation circuit of claim 1, wherein the controllable bias voltage generator comprises:
a first transistor, comprising:
a first terminal, coupled to a first system voltage;
a control terminal, coupled to the adaptive bias control circuit; and
a second terminal, coupled to the signal input terminal of the power amplifier.

10. The temperature compensation circuit of claim 9, wherein the adaptive bias control circuit comprises a controllable capacitor, coupled to the control terminal of the first transistor, and for adjusting the adaptive bias according to the power of the AC signal and the third control signal.

11. The temperature compensation circuit of claim 10, wherein the controllable capacitor comprises a plurality of capacitor control units, and each capacitor control unit comprises:
a switch, coupled between the read-only memory and a system common terminal; and
a capacitor, having one end coupled to the switch, and another end coupled to the system common terminal or the control terminal of the first transistor;
wherein the switch is connected or disconnected according to the third control signal, to control an effective capacitance value of the each capacitor control unit to the control terminal of the first transistor.

12. The temperature compensation circuit of claim 1, wherein the power amplifier is a metal-oxide semiconductor field effect transistor, the output terminal of the power amplifier is a drain of the metal oxide semiconductor field effect transistor, the input terminal of the power amplifier is a gate of the metal oxide semiconductor field effect transistor, and a source of the metal-oxide semiconductor field effect transistor is coupled to a system common terminal.

13. The temperature compensation circuit of claim 1, wherein the power amplifier is a transistor, the output terminal of the power amplifier is a first terminal of the transistor, the input terminal of the power amplifier is a control terminal of the transistor, a second terminal of the transistor is coupled to a system common terminal, and the transistor is a germanium-silicon NPN heterojunction bipolar transistor.

14. The temperature compensation circuit of claim 7, wherein the controllable bias voltage generator further comprises:
a controllable current source, coupled to the control terminal of the first transistor, for controlling a current inputted to the control terminal of the first transistor according to a first system voltage and the second control signal, to generate the bias voltage of the power amplifier via a bias resistor.

15. The temperature compensation circuit of claim 14, wherein the controllable bias voltage generator further comprises:
a diode circuit, coupled between the control terminal of the first transistor and the system common terminal.

16. The temperature compensation circuit of claim 1, wherein the controllable output terminal voltage generator comprises a low-dropout regulator or a resistor.

17. The temperature compensation circuit of claim 1, wherein the controllable impedance matching circuit is coupled between the controllable output terminal voltage generator and the signal output terminal of the power amplifier, or is coupled between the signal input terminal of the power amplifier and a system signal input terminal.

18. The temperature compensation circuit of claim 1, wherein the temperature compensation circuit and the power amplifier are fabricated by a Complementary Metal-Oxide-Semiconductor (CMOS) process and are disposed on a same die.

* * * * *